(12) United States Patent
Cheng et al.

(10) Patent No.: US 11,146,056 B2
(45) Date of Patent: Oct. 12, 2021

(54) INTERFACE CONTROL CIRCUIT AND CONTROL METHOD THEREOF

(71) Applicant: Richtek Technology Corporation, Zhubei (TW)

(72) Inventors: Yu-Jen Cheng, New Taipei (TW); Chih-Wei Mu, New Taipei (TW); Sheng-Tsung Chen, Hsinchu (TW); Chieh-Min Lo, Miaoli (TW); Wei-Chung Chang, Hsinchu (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 0 days.

(21) Appl. No.: 15/931,187

(22) Filed: May 13, 2020

(65) Prior Publication Data
US 2021/0119438 A1    Apr. 22, 2021

(30) Foreign Application Priority Data

Oct. 21, 2019   (TW) .................................. 108137912

(51) Int. Cl.
*H02H 3/26* (2006.01)
*H03K 19/0175* (2006.01)
*H02H 1/00* (2006.01)

(52) U.S. Cl.
CPC ............ *H02H 3/26* (2013.01); *H02H 1/0007* (2013.01); *H03K 19/017509* (2013.01)

(58) Field of Classification Search
CPC ................... H02H 3/26; H02H 1/0007; H03K 19/017509; H03K 19/00315
See application file for complete search history.

(56) References Cited

U.S. PATENT DOCUMENTS

| | | | |
|---|---|---|---|
| 11,023,007 B2* | 6/2021 | Beckham | G06F 1/182 |
| 2006/0176061 A1* | 8/2006 | Raymond | G01M 3/165 |
| | | | 324/539 |
| 2019/0079123 A1 | 3/2019 | Kim | |

* cited by examiner

*Primary Examiner* — Adolf D Berhane
*Assistant Examiner* — Afework S Demisse
(74) *Attorney, Agent, or Firm* — Tung & Associates

(57) ABSTRACT

An interface control circuit complying with an interface specification includes: an interface signal transceiver circuit and a protection circuit. The interface signal transceiver circuit is coupled to a first interface connection pin and a second interface connection pin of a first interface connector circuit. The interface signal transceiver circuit is for transmitting and/or receiving an interface signal according to the interface specification. When the interface signal transceiver circuit operates under a first state, the protection circuit determines whether a foreign object exists between the first interface connection pin and the second interface connection pin according to a voltage change or a current change at the second interface connection pin. Under the first state, the interface signal transceiver circuit generates a pull-up signal and a pull-down signal which are toggled with each other at the first interface connection pin.

29 Claims, 4 Drawing Sheets

US 11,146,056 B2

INTERFACE CONTROL CIRCUIT AND CONTROL METHOD THEREOF

CROSS REFERENCE

The present invention claims priority to TW 108137912 filed on Oct. 21, 2019.

BACKGROUND OF THE INVENTION

Field of Invention

The present invention relates to an interface control circuit; particularly, it relates to such interface control circuit capable of detecting a foreign object such as water or moisture through sensing a pin voltage change. The present invention also relates to a control method of such interface control circuit.

Description of Related Art

Please refer to FIG. 1, which shows a schematic diagram of a conventional interface control circuit (i.e., conventional interface control circuit 19). The conventional interface control circuit 19 can be, for example but not limited to, an interface control circuit which complies with a universal serial bus (USB) Type-C specification; the conventional interface control circuit 19 transmits power to and/or communicate with another interface control circuit which complies with the same USB Type-C specification via interface connection pins (for example but not limited to VBUS pin, CC1 pin, CC2 pin, D+ pin and D− pin shown in FIG. 1) of an interface connector circuit 20. In using the conventional interface control circuit 19, when a user intentionally causes the interface connector circuit 20 to contact with a foreign object 30 (particularly liquid such as but not limited to water), for example when the user is taking pictures underwater or swimming, etc., or unintentionally causes the interface connector circuit 20 to contact with the foreign object 30, for example when the user accidentally falls into water, gets wet in the rain or is splashed by drinks, etc., the interface connection pin may become rusted due to ionization. In an even worse case, if the interface connection pin CC1 or the interface connection pin CC2 (a current source of which is provided by the interface control circuit 19) and the interface connection pin VBUS (a voltage source of which is provided by the conventional interface control circuit 19) are both affected by the foreign object, a severe damage may occur.

The present invention is advantageous over the prior art, in that: the present invention can detect whether a foreign object exists. Besides, when it is determined that a foreign object indeed exists between the interface connection pins (for example but not limited to the VBUS pin, CC1 pin, CC2 pin, D+ pin or D− pin shown in FIG. 1), the present invention can perform a corresponding protection operation, to avoid rusting of the interface connection pins and the risk of severe damage, thus prolonging the life time of the circuits.

SUMMARY OF THE INVENTION

From one perspective, the present invention provides an interface control circuit complying with an interface specification, the interface control circuit comprising: an interface signal transceiver circuit coupled to a first interface connection pin and a second interface connection pin of a first interface connector circuit, the interface signal transceiver circuit being configured to operably transmit and/or receive an interface signal according to the interface specification, wherein under the first state, the interface signal transceiver circuit is configured to operably generate toggled first pull-up and first pull-down signals at the first interface connection pin; and a protection circuit, wherein when the interface signal transceiver circuit operates under a first state, the protection circuit is configured to operably determine whether a foreign object exists between the first interface connection pin and the second interface connection pin according to a voltage change or a current change between a first time point and a second time point at the second interface connection pin; wherein the first time point and the second time point correspond respectively to a time point before and a time point after the first pull-up signal is toggle to the first pull-down signal or the first pull-down signal is toggled to the first pull-up signal; or the first time point and the second time point correspond respectively to two consecutive time points after the first pull-up signal is toggle to the first pull-down signal or the first pull-down signal is toggled to the first pull-up signal.

In one embodiment, under the first state, the first interface connector circuit is not connected to any other interface connector circuit or a power supply connection pin of the first interface connector circuit has not yet been able to transmit power.

In one embodiment, the interface connector circuit includes: a first pull-up circuit, which is coupled between a pull-up power source and the first interface connection pin and which is configured to operably provide the first pull-up signal; and a first pull-down circuit, which is coupled between a ground level and the first interface connection pin and which is configured to operably provide the first pull-down signal; wherein the first pull-up circuit includes: a first pull-up resistor or a first pull-up current source, configured to operably generate the first pull-up signal; wherein the first pull-down circuit includes: a first pull-down resistor or a first pull-down current source, configured to operably generate the first pull-down signal.

In one embodiment, under the first state, the first pull-up signal and the first pull-down signal are toggled with each other periodically; wherein the protection circuit correspondingly and periodically determines whether the foreign object exists between the first interface connection pin and the second interface connection pin according to the voltage change or the current change at the second interface connection pin.

In one embodiment, under the first state, the second interface connection pin is floating or is coupled to a ground level via a second pull-down resistor.

In one embodiment, under the first state, one of the first pull-up signal and the first pull-down signal corresponds to a floating state at the first interface connection pin.

In one embodiment, the interface control circuit complies with a universal serial bus (USB) Type-C specification.

In one embodiment, the first interface connection pin is a channel configuration pin of the USB Type-C specification, whereas, the second interface connection pin is one selected from a group consisting of VBUS pin, D+ pin, D− pin, SBU1 pin, SBU2 pin, TX+ pin, TX− pin, RX+ pin or RX− pin which are pins complying with the USB Type-C specification.

In one embodiment, the first state corresponds to a connection-and-direction-detection state defined by the USB Type-C specification, wherein under the connection-and-direction-detection state and under a dual role port (DRP)

mode, the interface signal transceiver circuit is configured to operably generate the first pull-up signal and the first pull-down signal which are toggled with each other at the channel configuration pin according to the USB Type-C specification, for detecting whether the first interface connector circuit is connected to another interface connector circuit and/or determine a power supply direction between the first interface connector circuit and another interface connector circuit.

In one embodiment, the first interface connection pin is one selected from a group consisting of VBUS pin, D+ pin, D− pin, SBU1 pin, SBU2 pin, TX+ pin, TX− pin, RX+ pin or RX− pin which are pins complying with the USB Type-C specification, whereas, the second interface connection pin is one selected from a group consisting of VBUS pin, D+ pin, D− pin, SBU1 pin, SBU2 pin, TX+ pin, TX− pin, RX+ pin or RX− pin which are pins complying with the USB Type-C specification; wherein the second interface connection pin is different from the first interface connection pin.

In one embodiment, before the first pull-down signal at the first interface connection pin is toggled to the first pull-up signal, a voltage at the second interface connection pin corresponds to a first level, and after the first pull-down signal at the first interface connection pin is toggled to the first pull-up signal, when a first predetermined period has passed, the voltage at the second interface connection pin corresponds to a second level; and before the first pull-up signal at the first interface connection pin is toggled to the first pull-down signal, the voltage at the second interface connection pin corresponds to a third level, and after the first pull-up signal at the first interface connection pin is toggled to the first pull-down signal, when a second predetermined period has passed, the voltage at the second interface connection pin corresponds to a fourth level; and before the first pull-down signal at the first interface connection pin is again toggled to the first pull-up signal, the voltage at the second interface connection pin corresponds to a fifth level; and the protection circuit is configured to operably determine whether the foreign object exists between the first interface connection pin and the second interface connection pin according to one of the following conditions: (1) a condition where the third level is greater than the second level; (2) a condition where the third level is greater than the fourth level; (3) a condition where the third level is greater than the fifth level; (4) a condition where a difference between the third level and the first level is greater than a threshold; or (5) a combination of two or more of the above conditions.

In one embodiment, before the first pull-down signal at the first interface connection pin is toggled to the first pull-up signal, a voltage at the second interface connection pin corresponds to a first level, and before the first pull-up signal at the first interface connection pin is toggled to the first pull-down signal, the voltage at the second interface connection pin corresponds to a third level; wherein when a difference between the third level and the first level is greater than a threshold, the protection circuit determines that the foreign object exists between the first interface connection pin and the second interface connection pin.

In one embodiment, the foreign object is an electrolyte material, liquid or water.

In one embodiment, the first interface connector circuit is a plug or a receptacle.

In one embodiment, when it is determined that the foreign object indeed exists between the first interface connection pin and the second interface connection pin, the protection circuit performs one of the following operations: (1) the protection circuit controlling the first interface connection pin to be floating; (2) the protection circuit reducing an average current of the first pull-up signal; (3) the protection circuit outputting the first pull-down signal; (4) the protection circuit cutting off an external power path or an internal power path of the first interface connector circuit; (5) the protection circuit issuing an alarming signal; or (6) a combination of two or more of the above operations.

From another perspective, the present invention provides a control method for controlling an interface control circuit, wherein the interface control circuit complies with an interface specification, and wherein the interface control circuit includes an interface connector circuit coupled to a first interface connection pin and a second interface connection pin of a first interface connector circuit, the interface connector circuit being configured to operably transmit and/or receive an interface signal according to the interface specification; the control method comprising: under a first state, controlling the interface connector circuit to generate a first pull-up signal and a first pull-down signal which are toggled with each other at the first interface connection pin; and when the interface connector circuit operates under the first state, determining whether a foreign object exists between the first interface connection pin and the second interface connection pin according to a voltage change or a current change between a first time point and a second time point at the second interface connection pin; wherein the first time point corresponds to a time point when the first pull-up signal is toggle to the first pull-down signal or the first pull-down signal is toggled to the first pull-up signal, and the second time point corresponds to an end time point of a predetermined time period following the first time point.

In one embodiment, before the first pull-down signal at the first interface connection pin is toggled to the first pull-up signal, a voltage at the second interface connection pin corresponds to a first level, and wherein after the first pull-down signal at the first interface connection pin is toggled to the first pull-up signal, when a first predetermined period has passed, the voltage at the second interface connection pin corresponds to a second level, and wherein before the first pull-up signal at the first interface connection pin is toggled to the first pull-down signal, the voltage at the second interface connection pin corresponds to a third level, and wherein after the first pull-up signal at the first interface connection pin is toggled to the first pull-down signal, when a second predetermined period has passed, the voltage at the second interface connection pin corresponds to a fourth level, and wherein before the first pull-down signal at the first interface connection pin is again toggled to the first pull-up signal, the voltage at the second interface connection pin corresponds to a fifth level; wherein the step of determining whether a foreign object exists includes one of the following: (1) when the third level is greater than the second level, determining that the foreign object exists between the first interface connection pin and the second interface connection pin; (2) when the third level is greater than the fourth level, determining that the foreign object exists between the first interface connection pin and the second interface connection pin; (3) when the third level is greater than the fifth level, determining that the foreign object exists between the first interface connection pin and the second interface connection pin; (4) when a difference between the third level and the first level is greater than a threshold, determining that the foreign object exists between the first interface connection pin and the second interface connection pin; or (5) two or more of the above in combination.

In one embodiment, when it is determined that the foreign object indeed exists between the first interface connection pin and the second interface connection pin, the control method further performs one of the following steps: (1) controlling the first interface connection pin to be floating; (2) reducing an average current of the first pull-up signal; (3) outputting the first pull-down signal; (4) cutting off an external power path or an internal power path of the first interface connector circuit; (5) issuing an alarming signal; or (6) a combination of two or more of the above steps.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations between the circuits and the signal waveforms, but not drawn according to actual scale of circuit sizes and signal amplitudes and frequencies.

Figure 1:
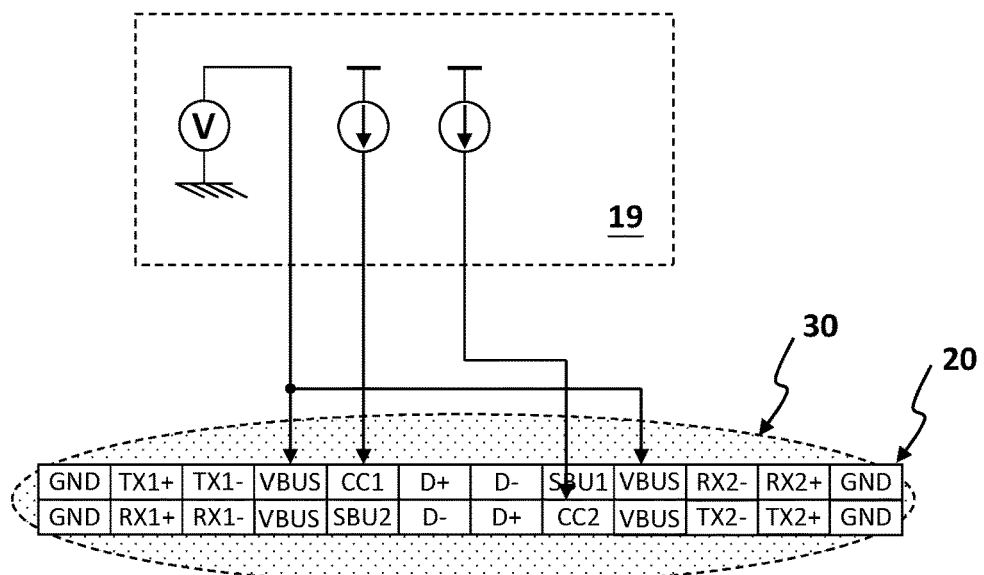
FIG. 1 shows a schematic diagram of a conventional interface control circuit.
Figure 2:
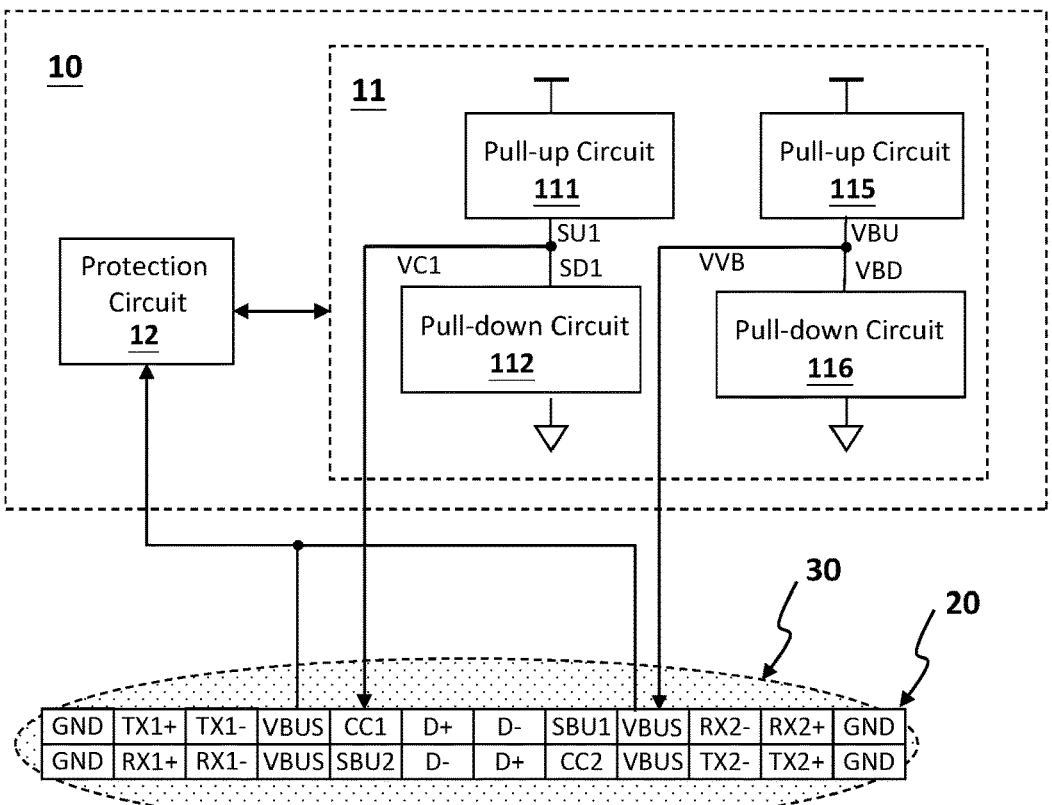
FIG. 2 shows a schematic diagram of an interface control circuit according to an embodiment of the present invention.

Please refer to FIG. 2, which shows a schematic diagram of an interface control circuit (i.e., an interface control circuit 10) according to an embodiment of the present invention. Via an interface connection pin (for example but not limited to VBUS pin, CC1 pin, CC2 pin, D+ pin or D− pin shown in FIG. 2) of an interface connector circuit 20, the interface control circuit 10 is configured to operably perform operations of for example but not limited to power transmission and/or data transmission with other interface control circuit which complies with the same specification (for example but not limited to a universal serial bus (USB) Type-C specification). The interface control circuit 10 comprises an interface signal transceiver circuit 11 and a protection circuit 12. The interface signal transceiver circuit 11 is coupled to the interface connection pin (for example but not limited to VBUS pin, CC1 pin, CC2 pin, D+ pin or D− pin shown in FIG. 2) of the interface connector circuit 20, to operably transmit and/or receive an interface signal. In one embodiment, the interface signal can be, for example but not limited to, a power type signal (e.g., VBUS), an analog signal or a digit signal (e.g., a signal at CC1 pin, CC2 pin, D+ pin or D− pin).

More specifically, each interface connection pin in concern can be coupled to a corresponding pull-up circuit and a corresponding pull-down circuit, to provide a corresponding pull-up signal and a corresponding pull-down signal at this connection pin. The pull-up signal and the pull-down signal correspond to the above-mentioned interface signals if they comply with the interface specification, that is, the pull-up signal and the pull-down signal can be, for example but not limited to, a power signal, an analog signal or a digit signal complying with the interface specification. For example, as shown in FIG. 2, the interface signal transceiver circuit 11 can include a pull-up circuit 111 and a pull-down circuit 112, which are electrically connected to the interface connection pin CC1 of the interface connector circuit 20, wherein the pull-up circuit 111 is configured to operably provide a pull-up signal SU1 at the interface connection pin CC1, whereas, the pull-down circuit 112 is configured to operably provide a pull-down signal SD1 at the interface connection pin CC1. Moreover, for another example, as shown in FIG. 2, the interface signal transceiver circuit 11 can include a pull-up circuit 115 and a pull-down circuit 116, wherein the pull-up circuit 115 is configured to operably provide a pull-up signal VBU at the interface connection pin VBUS, whereas, the pull-down circuit 116 is configured to operably provide a pull-down signal VBD at the interface connection pin VBUS. Under a situation where the pull-up signals SU1 and VBU and the pull-down signals SD1 and VBD comply with the interface specification, the pull-up signal VBU and the pull-down signal VBD are configured to operably provide a power supply voltage VVB complying with the USB Type-C specification, whereas, the pull-up signals SU1 and the pull-down signals SD1 are configured to operably provide a voltage signal VC1 complying with the USB Type-C specification at the interface connection pin CC1.

In one embodiment, under a first state, the interface signal transceiver circuit 11 is configured to operably generate a signal at the first interface connection pin, and toggle the signal between a first pull-up level (i.e. first pull-up signal) and a first pull-down level (i.e. first pull-down signal). In another way to describe it, the interface signal transceiver circuit 11 is configured to operably generate alternating (or toggled) first pull-up and first pull-down signals which are toggled with each other. In this embodiment, when the interface signal transceiver circuit 11 operates under the first state, the protection circuit 12 is configured to operably determine whether a foreign object exists between the first interface connection pin and the second interface connection pin according to a change of a voltage at the second interface connection pin or according to a change of a current flowing through the second interface connection pin.

Figure 3:
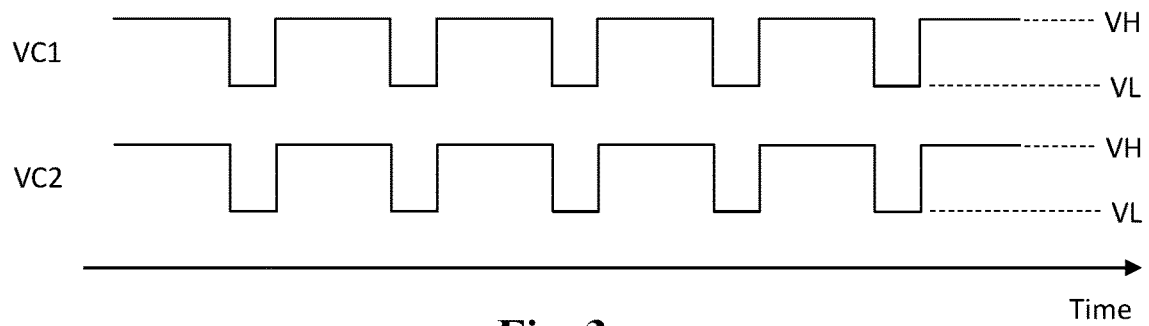
FIG. 3 shows operational waveforms of an interface control circuit according to an embodiment of the present invention.

Please refer to FIG. 2 along with FIG. 3. FIG. 3 shows operational waveforms of an interface control circuit according to an embodiment of the present invention. In one embodiment, the above-mentioned first interface connection pin can correspond to for example a channel configuration pin (e.g., the interface connection pin CC1) of the USB Type-C specification, whereas, the above-mentioned second interface connection pin can correspond to for example one of interface connection pins of the USB Type-C specification consisting of VBUS pin, D+ pin, D− pin, SBU1 pin, SBU2 pin, TX+ pin, TX− pin, RX+ pin or RX− pin. In this embodiment, the TX+ pin can correspond to a TX1+ pin or a TX2+ pin, while, the TX− pin can correspond to a TX1− pin or a TX2− pin. Moreover, in this embodiment, the RX+ pin can correspond to a RX1+ pin or a RX2+ pin, while, the RX− pin can correspond to a RX1− pin or a RX2− pin.

As shown in FIG. 3, according to the USB Type-C specification, under the connection-and-direction-detection state and under a dual role port (DRP) mode, the interface signal transceiver circuit 11 is configured to operably generate the pull-up signal and the pull-down signal which are toggled with each other at a channel configuration pin (e.g., the interface connection pin CC1) (a voltage at the interface connection pin CC1 corresponds to a voltage signal VC1) or another channel configuration pin (e.g., the interface connection pin CC2) (a voltage at the interface connection pin CC2 corresponds to a voltage signal VC2) according to the USB Type-C specification. The pull-up signal and the pull-down signal which are toggled with each other are configured to operably detect whether the interface connector circuit 20 is connected to another interface connector circuit and/or determine power supply direction between the interface connector circuit 20 and another interface connector circuit. In more detail, under a situation where the interface connector circuit 20 has not yet been connected to another interface connector circuit, as shown in FIG. 3, the pull-up signal can correspond to for example a high level VH (e.g., 3V) of the voltage signal VC1 at the interface connection pin CC1, whereas, the pull-down signal can correspond to for example a low level VL (e.g., 0V) of the voltage signal VC1 at the interface connection pin CC1. The voltage signal VC2 at the interface connection pin CC2 operates in the same way as the voltage signal VC1 at the interface connection pin CC1, so the details thereof are not redundantly repeated here. According to the USB Type-C specification, under the connection-and-direction-detection state and under the DRP mode, the interface signal transceiver circuit can detect whether the interface connector circuit 20 is connected to another interface connector circuit and/or determine power supply direction between the interface connector circuit 20 and another interface connector circuit according to a voltage level at the interface connection pin CC1 or a voltage level at the interface connection pin CC2 (i.e., the voltage signal VC1 or the voltage signal VC2), because there is a voltage change in the above-mentioned pull-up signal and pull-down signal between connected and not-connected states. The criteria of determination according to the voltage signal VC1 at the interface connection pin CC1 or the voltage signal VC2 at the interface connection pin CC2 are defined in the USB Type-C specification, so the details thereof are not redundantly explained here.

Under the above-mentioned connection-and-direction-detection state and under the DRP mode, the pull-up signal and the pull-down signal which are toggled with each other are generated at the channel configuration pin (i.e., the interface connection pin CC1 or CC2). Under such circumstance, if the protection circuit 12 detects an abnormal voltage change or a current change at an interface connection pin (e.g., one of the above-mentioned other interface connection pins of the USB Type-C specification) which should be floating or should be coupled to a ground level via a pull-down resistor, it can be determined that a foreign object (as shown by the foreign object 30 in FIG. 3) exists between the channel configuration pin (i.e., the interface connection pin CC1 or CC2) and this other interface connection pin.

The above-mentioned foreign object 30 may be any material which can form an electrically conductive path between the interface connection pins. That is, the foreign object 30 can be, for example but not limited to, an electrolyte material, liquid or water. The electrically conductive path can be resistive, capacitive or both.

To give a specific example, when water or moisture exists between the channel configuration pin (e.g., the interface connection pin CC1) and another interface connection pin (for example but not limited to the interface connection pin VBUS), when the channel configuration pin (CC1) is toggled between the pull-up signal and pull-down signal, because water or moisture forms an electrically conductive path between the channel configuration pin (CC1) and the interface connection pin VBUS, the protection circuit 12 can detect a voltage change and/or a current change (which changes as the pull-up signal and the pull-down signal change) at the interface connection pin VBUS which should be floating or coupled to a ground level via a pull-down resistor under the connection-and-direction-detection state. As a result, the interface control circuit 10 can determine that a foreign object exists between the channel configuration pin (e.g., the interface connection pin CC1 or CC2) and the interface connection pin VBUS.

From one perspective, in one embodiment, the above-mentioned "connection-and-direction-detection state" complying with the USB Type-C specification can correspond to the above-mentioned "first state".

One advantage of the present invention is that: under the first state, the interface control circuit 10 of the present invention can detect whether a foreign object exists between the interface connection pins of the interface connector circuit 20 under a situation where the interface connector circuit 20 is not connected to any other interface connector circuit. From another perspective, under the first state, the interface control circuit 10 of the present invention can detect whether a foreign object exists between the interface connection pins of the interface connector circuit 20 under a situation where a power supply connection pin (which corresponds to for example the interface connection pin VBUS) of the interface connector circuit 20 has not yet been able to transmit power. In addition, the interface control circuit 10 of the present invention can detect whether a foreign object exists between the interface connection pins of the interface connector circuit 20 regardless of whether the interface connector circuit 20 is a plug or a receptacle. Besides, the present invention has another advantage in that: the interface control circuit 10 of the present invention can detect whether a foreign object exists between two directly neighboring interface connection pins (e.g., the interface connection pins CC1 and VBUS, the interface connection pins CC1 and SBU2, or the interface connection pins CC1 and D+, which are directly neighboring each other, and the interface control circuit 10 of the present invention can also detect whether a foreign object exists between two not-directly neighboring interface connection pins (e.g., the interface connection pins CC1 and TX1+, the interface connection pins CC1 and SBU1, or the interface connection pins CC1 and RX1+, which are not directly neighboring each other).

Figure 4:
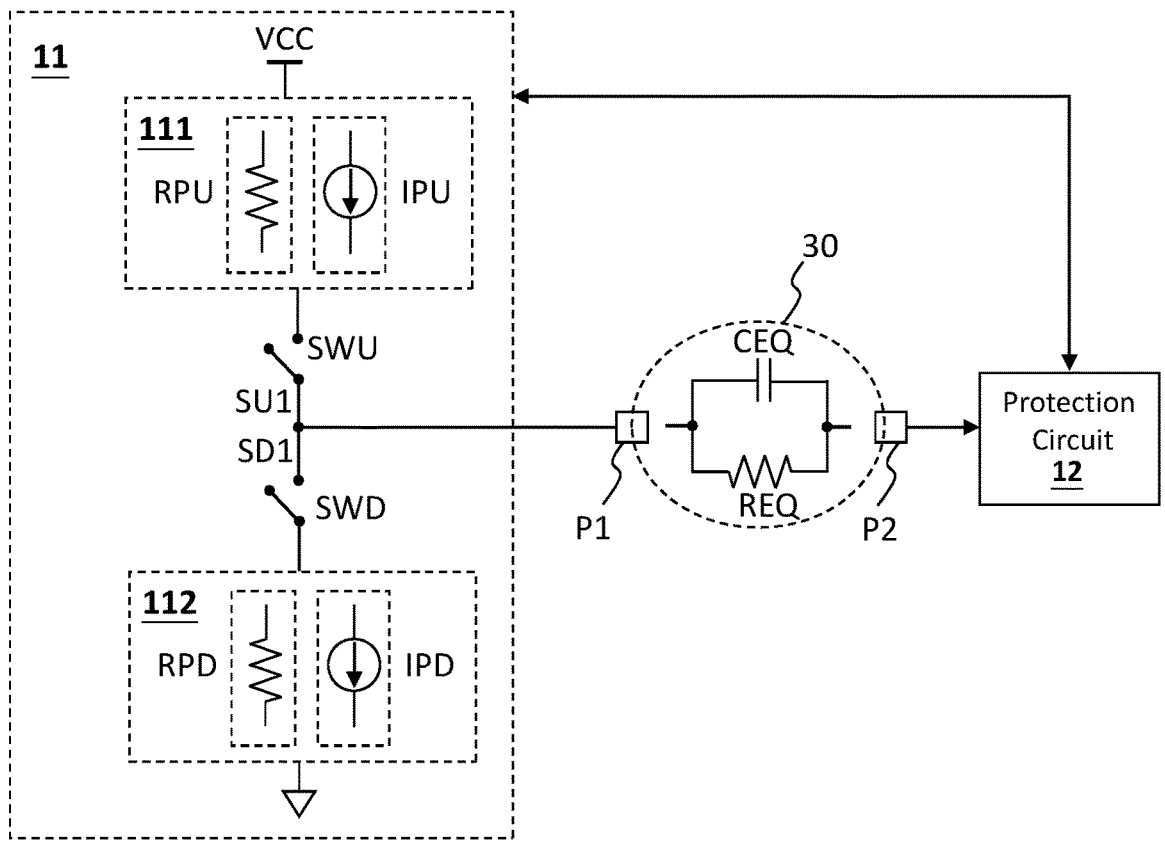
FIG. 4 shows a specific embodiment of an interface signal transceiver circuit and a protection circuit.

Please refer to FIG. 4, which shows a specific embodiment of an interface signal transceiver circuit and a protection circuit. As shown in FIG. 4, in one embodiment, the interface signal transceiver circuit 11 can include a pull-up circuit 111 and a pull-down circuit 112. The pull-up circuit 111 is coupled between a pull-up power source VCC and the first interface connection pin P1 and is configured to operably provide the first pull-up signal SU1. The pull-down circuit 112 is coupled between a ground level and the first interface connection pin P1 and is configured to operably provide the first pull-down signal SD1. The first interface connection pin P1 of this embodiment can correspond to for example the above-mentioned channel configuration pin (i.e., the interface connection pin CC1 or CC2). To be more specific, as shown in FIG. 4, in one embodiment, the first pull-up circuit 111 includes a first pull-up resistor RPU or a first pull-up current source IPU, configured to operably generate the first pull-up signal SU1. In one embodiment, the first pull-down circuit 112 includes a first pull-down resistor RPD or a first pull-down current source IPD, configured to operably generate the first pull-down signal SD1. In one embodiment, a pull-up switch SWU and a pull-down switch SWD are provided, which are configured to operably control whether a corresponding electrically conductive path between the above-mentioned resistor or current source and the first interface connection pin P1 is conductive, thereby controlling the first interface connection pin P1 to toggle between the pull-up signal and the pull-down signal. In one embodiment, the interface signal transceiver circuit 11 controls the first interface connection pin P1 to toggle between the pull-up signal and the pull-down signal according to the interface specification (e.g., USB Type-C specification). In another embodiment, the protection circuit 12 controls the first interface connection pin P1 to toggle between the pull-up signal and the pull-down signal. The details will be explained in detail later.

Please still refer to FIG. 4. when a foreign object 30 exists between the first interface connection pin P1 and a second interface connection pin P2, an equivalent circuit of the foreign object 30 is shown in FIG. 4, which includes an equivalent capacitor CEQ and an equivalent resistor REQ. The above-mentioned first pull-up signal SU1 and first pull-down signal SD1 which are toggled with each other will cause a certain voltage change or current change at the second interface connection pin P2 through the equivalent circuit. As shown in FIG. 4, the protection circuit 12 can determine whether the foreign object 30 exists between the first interface connection pin P1 and the second interface connection pin P2 by detecting the above-mentioned voltage change or current change at the second interface connection pin P2.

Figure 5:
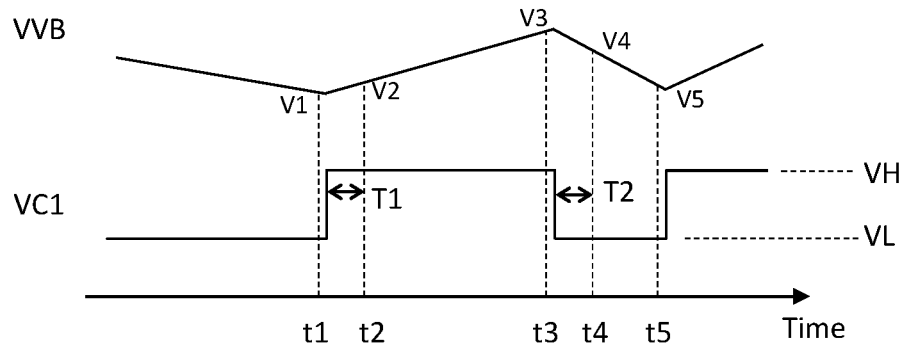
FIG. 5 shows operational waveforms of an interface control circuit according to a specific embodiment of the present invention.

Please refer to FIG. 5, which shows operational waveforms of an interface control circuit according to a specific embodiment of the present invention. In this embodiment, the interface signal transceiver circuit 11 is configured to operably generate the pull-up signal and the pull-down signal which are toggled with each other at the channel configuration pin (e.g., the interface connection pin CC1), to operably detect whether the interface connector circuit 20 is connected to another interface connector circuit and/or determine power supply direction between the interface connector circuit 20 and another interface connector circuit. Concurrently, the protection circuit 12 can determine whether a foreign object exists between the interface connection pins (in this embodiment, between the interface connection pin CC1 and the interface connection pin VBUS) of the interface connector circuit 20 through detecting a voltage change at the interface connection pin VBUS.

Figure 6:
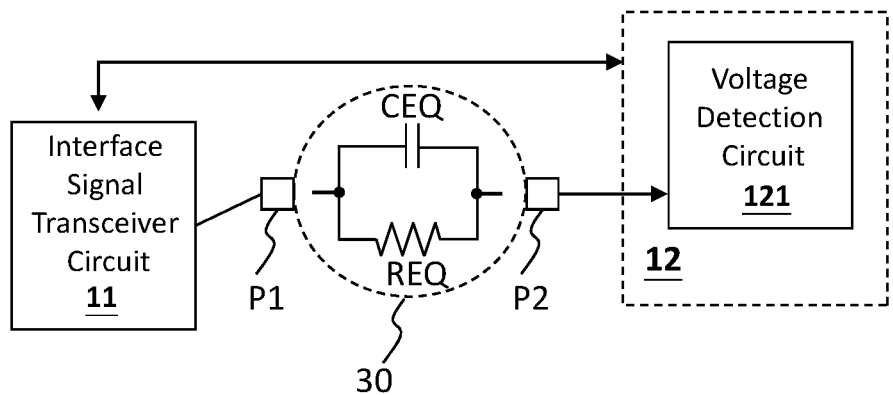
FIG. 6 shows a specific embodiment of a protection circuit.

Please refer to FIG. 5 along with FIG. 6, which explain the operation details by a specific embodiment. FIG. 6 shows a specific embodiment of a protection circuit. In this embodiment, the protection circuit 12 includes a voltage detection circuit 121 which is configured to operably detect a voltage (which for example corresponds to the power supply voltage VVB of the embodiment shown in FIG. 5) at the second interface connection pin P2 (which for example corresponds to the interface connection pin VBUS shown in FIG. 2). More specifically, in this embodiment, before (e.g., at the time point t1) the first pull-down signal at the channel configuration pin (which corresponds to for example a low level VL of the voltage signal VC1 of FIG. 5 and the first interface connection pin P1 of FIG. 4) is toggled to the first pull-up signal (which corresponds to for example a high level VH), the protection circuit 12 can measure the power supply voltage VVB at the interface connection pin VBUS (which corresponds to a first voltage level V1 at the second interface connection pin P2). After the low level VL at the channel configuration pin (e.g., the interface connection pin CC1) is toggled to the high level VH, when a first predetermined period T1 has passed (i.e., at the time point t2), the protection circuit 12 can measure a second voltage level V2 at the interface connection pin VBUS. Before (i.e., at the time point t3) the high level VH at the channel configuration pin (e.g., the interface connection pin CC1) is toggled to the low level VL, the protection circuit 12 can measure a third voltage level V3 at the interface connection pin VBUS. After the high level VH at the channel configuration pin (e.g., the interface connection pin CC1) is toggled to the low level VL, when a second predetermined period T2 has passed (i.e., at the time point t4), the protection circuit 12 can measure a fourth voltage level V4 at the interface connection pin VBUS. Before (i.e., at the time point t5) the low level VL at the channel configuration pin (e.g., the interface connection pin CC1) is again toggled to the high level VH, the protection circuit 12 can measure a fifth voltage level V5 at the interface connection pin VBUS.

In one embodiment, the protection circuit 12 is configured to operably determine whether a foreign object exists between the channel configuration pin (e.g., the interface connection pin CC1) and the interface connection pin VBUS according to at least one of the following conditions: (1) a condition where the third voltage level V3 is greater than the second voltage level V2; (2) a condition where the third voltage level V3 is greater than the fourth voltage level V4; (3) a condition where the third voltage level V3 is greater than the fifth voltage level V5; (4) a condition where a difference between the third voltage level V3 and the first voltage level V1 is greater than a threshold; or (5) a combination of two or more of the above conditions.

In one embodiment, the above-mentioned first predetermined period T1 can range between 1 minisecond (ms) to 100 ms, whereas, the above-mentioned second predetermined period T2 can range between 1 ms to 100 ms. In another embodiment, the above-mentioned first predetermined period T1 can range between 1 ms to 10 ms, whereas, the above-mentioned second predetermined period T2 can range between 1 ms to 10 ms. In one embodiment, particularly in a situation where the channel configuration pin CC1 or CC2 is the interface connection pin in concern, it is required that a sum of the above-mentioned first predetermined period T1 plus the above-mentioned second predetermined period T2 is smaller than 100 ms; however, with respect to a pin other than the channel configuration pin CC1 or CC2, the above-mentioned first predetermined period T1 and the above-mentioned second predetermined period T2 can be different values depending upon the practical needs.

From one perspective, the protection circuit 12 is configured to operably determine whether a foreign object exists between the first interface connection pin P1 and the second interface connection pin P2 according to a change of a voltage at the second interface connection pin P2 or according to a change of a current flowing through the second interface connection pin P2 between a first time point and a second time point. In one embodiment, the first time point and the second time point correspond respectively to a time point before and a time point after the first pull-up signal is toggle to the first pull-down signal or the first pull-down signal is toggled to the first pull-up signal. For example, the first time point and the second time point correspond respectively to time points t1 and t2, or correspond respectively to time points t3 and t5 as shown in FIG. 5. In one embodiment, the first time point and the second time point correspond respectively to two consecutive time points after the first pull-up signal is toggle to the first pull-down signal or the first pull-down signal is toggled to the first pull-up signal. For example, the first time point and the second time point correspond respectively to time points t2 and t3 as shown in FIG. 5.

The toggling between the high level VH and the low level VL at the channel configuration pin (e.g., the interface connection pin CC1), in one embodiment, can be achieved by the interface signal transceiver circuit 11 which controls the channel configuration pin (e.g., the interface connection pin CC1) to toggle between the pull-up signal and the pull-down signal according to the interface specification (e.g., USB Type-C specification). In another embodiment, the protection circuit 12 can control the channel configuration pin (e.g., the interface connection pin CC1) to toggle between the pull-up signal and the pull-down signal. Note that the first interface connection pin is not necessarily the channel configuration pin but can be another interface connection pin, and the second interface connection pin is not necessarily the interface connection pin VBUS but can be another interface connection pins.

In one embodiment, under the first state, the above-mentioned first pull-up signal and first pull-down signal can be periodically toggled with each other. Under such situation, the protection circuits 12 can correspondingly periodically determine whether a foreign object exists between the first interface connection pin and the second interface connection pin according to the voltage change at the second interface connection pin or according to the current change at the second interface connection pin.

In some embodiments, it is also practicable that after the present invention has performed foreign object determination one or more times under the first state and subsequently entered into another state (e.g., a standby state or an operation state), the circuitry can periodically enter back into the first state, to periodically perform the above-mentioned foreign object detection and determination.

Besides, in one embodiment, before the present invention performs the operations described in the embodiment shown in FIG. 5 and FIG. 6, the present invention can make a DC (direct current) voltage or a DC current detection on the voltage or current at the second interface connection pin, as a preliminary determination. When the preliminary determination finds that the voltage or current at the second interface connection pin is greater than a preliminary determination threshold, the present invention then proceed to perform the determination with reference to FIG. 5 and FIG. 6.

In one embodiment, the first interface connection pin can be one selected from a group consisting of VBUS pin, D+ pin, D− pin, SBU1 pin, SBU2 pin, TX+ pin, TX− pin, RX+ pin or RX− pin which are pins complying with the USB Type-C specification, whereas, the second interface connection pin can be one selected from a group consisting of VBUS pin, D+ pin, D− pin, SBU1 pin, SBU2 pin, TX+ pin, TX− pin, RX+ pin or RX− pin which are pins complying with the USB Type-C specification, wherein the second interface connection pin is different from the first interface connection pin. Under for the USB Type-C specification, it is possible that some of the first interface connection pins are not required to be toggled between a corresponding pull-up signal and a corresponding pull-down signal; under such situation, according to the present invention, the protection circuit 12 can cause the first interface connection pin to be toggled between the corresponding pull-up signal and the corresponding pull-down signal. In this case, the first state can correspond to, for example but not limited to, a protection detection state, which is provided for detecting whether a foreign object exists between the interface connection pins. In one embodiment, such protection detection state can be performed in a period which is allowed under the USB Type-C specification that does not affect other operations.

In one embodiment, the protection circuit 12 can directly control the pull-up circuit and the pull-down circuit; in another embodiment, the protection circuit 12 can indirectly control the pull-up circuit and the pull-down circuit via the interface signal transceiver circuit 11, to perform the above-mentioned operations.

Figure 7:
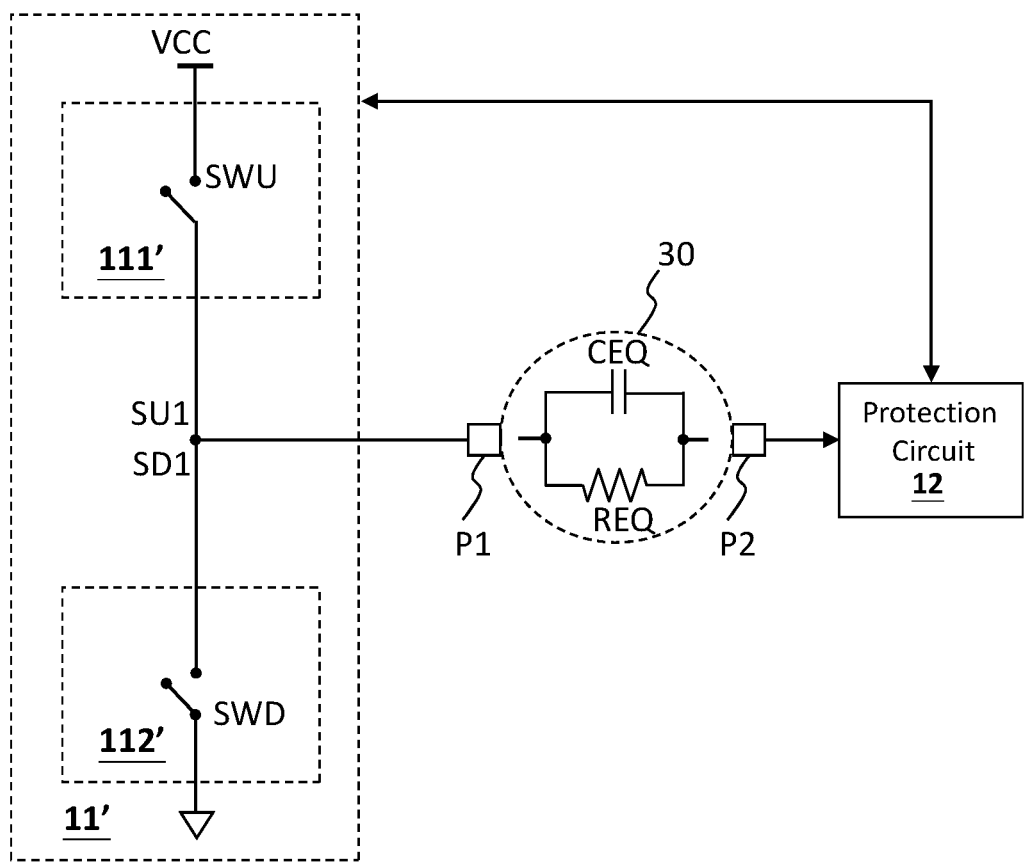
FIG. 7 shows another specific embodiment of an interface signal transceiver circuit and a protection circuit.

Please refer to FIG. 7, which shows another specific embodiment of an interface signal transceiver circuit (i.e., interface signal transceiver circuit 11') and a protection circuit. This embodiment is similar to the embodiment of FIG. 4, but is different in that: the pull-up circuit 111' includes a pull-up control switch SWU, which is configured to operably generate a pull-up signal SU1; the pull-down circuit 112' includes a pull-down control switch SWD, which is configured to operably generate a pull-down signal SD1.

The embodiment of FIG. 7 can be implemented similarly to the embodiments shown in FIG. 5 and FIG. 6, by replacing the channel configuration pin (e.g. the interface connection pin CC1) shown in FIG. 5 and FIG. 6 with anyone of the first interface connection pins and replacing the interface connection pin VBUS with anyone of the second interface connection pins. The embodiment shown in FIG. 7 operates similarly to the embodiments shown in FIG. 5 and FIG. 6, so the details thereof are not redundantly repeated here.

In one embodiment, one of the first pull-up signal SU1 or the first pull-down signal SD1 as shown in FIG. 4 or FIG. 7 can correspond to a floating state at the first interface connection pin P1 (e.g. P1 in FIG. 4 or FIG. 7). As more specific examples, the voltage at the first interface connection pin P1 can toggle between the high level VH and the floating state, or toggle between the floating state and the low level LV. The floating state at the first interface connection pin P1 can be achieved for example by controlling both switches SWU and SWD to be OFF.

Besides, in one embodiment, the number of the above-mentioned second interface connection pin can be plural. That is, the present invention can perform the above-mentioned voltage detection or current detection on plural second interface connection pins, to determine whether a foreign object exists between one single first interface connection pin and anyone of the plural second interface connection pins.

In one embodiment, when it is determined that a foreign object indeed exists between the first interface connection pin (which can correspond to anyone of the first interface connection pins as described above) and the second interface connection pin (which can correspond to anyone of the second interface connection pins as described above), the protection circuit 12 can perform one of the following operations: (1) the protection circuit 12 controls the first interface connection pin to be floating; (2) the protection circuit 12 reduces an average current of the pull-up signal; (3) the protection circuit 12 outputs the pull-down signal; (4) the protection circuit 12 cuts off an external power path or an internal power path of the interface connector circuit 20; (5) the protection circuit 20 issues an alarming signal (for example but not limited to light, sound or electrical message) to a system, a mobile device or a user; or (6) a combination of two or more of the above-mentioned operations. Through the above-mentioned operations, the present invention can effectively reduce the risk of rusting or damage.

The present invention has been described in considerable detail with reference to certain preferred embodiments thereof. It should be understood that the description is for illustrative purpose, not for limiting the scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. An interface control circuit complying with an interface specification, the interface control circuit comprising: an interface signal transceiver circuit coupled to a first interface connection pin and a second interface connection pin of a first interface connector circuit, the interface signal transceiver circuit being configured to operably transmit and/or receive an interface signal according to the interface specification, wherein under a first state, the interface signal transceiver circuit is configured to operably generate toggled first pull-up and first pull-down signals at the first interface connection pin; and
   a protection circuit, wherein when the interface signal transceiver circuit operates under the first state, the protection circuit is configured to operably determine whether a foreign object exists between the first interface connection pin and the second interface connection pin according to a voltage change or a current change between a first time point and a second time point at the second interface connection pin; wherein the first time point and the second time point correspond respectively to a time point before and a time point after the first pull-up signal is toggle to the first pull-down signal or the first pull-down signal is toggled to the first pull-up signal; or the first time point and the second time point correspond respectively to two consecutive time points after the first pull-up signal is toggle to the first pull-down signal or the first pull-down signal is toggled to the first pull-up signal.

2. The interface control circuit of claim 1, wherein under the first state, the first interface connector circuit is not connected to any other interface connector circuit or a power supply connection pin of the first interface connector circuit has not yet been able to transmit power.

3. The interface control circuit of claim 1, wherein the interface signal transceiver circuit includes:
   a first pull-up circuit, which is coupled between a pull-up power source and the first interface connection pin and which is configured to operably provide the first pull-up signal; and
   a first pull-down circuit, which is coupled between a ground level and the first interface connection pin and which is configured to operably provide the first pull-down signal;
   wherein the first pull-up circuit includes: a first pull-up resistor or a first pull-up current source, configured to operably generate the first pull-up signal;
   wherein the first pull-down circuit includes: a first pull-down resistor or a first pull-down current source, configured to operably generate the first pull-down signal.

4. The interface control circuit of claim 1, wherein under the first state, the first pull-up signal and the first pull-down signal are toggled with each other periodically; wherein the protection circuit correspondingly and periodically determines whether the foreign object exists between the first interface connection pin and the second interface connection pin according to the voltage change or the current change at the second interface connection pin.

5. The interface control circuit of claim 1, wherein under the first state, the second interface connection pin is floating or is coupled to a ground level via a second pull-down resistor.

6. The interface control circuit of claim 1, wherein under the first state, one of the first pull-up signal and the first pull-down signal corresponds to a floating state at the first interface connection pin.

7. The interface control circuit of claim 1, wherein the interface control circuit complies with a universal serial bus (USB) Type-C specification.

8. The interface control circuit of claim 7, wherein the first interface connection pin is a channel configuration pin of the USB Type-C specification, whereas, the second interface connection pin is one selected from a group consisting of VBUS pin, D+ pin, D− pin, SBU1 pin, SBU2 pin, TX+ pin, TX− pin, RX+ pin or RX− pin which are pins complying with the USB Type-C specification.

9. The interface control circuit of claim 8, wherein the first state corresponds to a connection-and-direction-detection state defined by the USB Type-C specification, wherein under the connection-and-direction-detection state and under a dual role port (DRP) mode, the interface signal transceiver circuit is configured to operably generate the first pull-up signal and the first pull-down signal which are toggled with each other at the channel configuration pin according to the USB Type-C specification, for detecting whether the first interface connector circuit is connected to another interface connector circuit and/or determine a power supply direction between the first interface connector circuit and another interface connector circuit.

10. The interface control circuit of claim 7, wherein the first interface connection pin is one selected from a group consisting of VBUS pin, D+ pin, D− pin, SBU1 pin, SBU2 pin, TX+ pin, TX− pin, RX+ pin or RX− pin which are pins complying with the USB Type-C specification, whereas, the second interface connection pin is one selected from a group consisting of VBUS pin, D+ pin, D− pin, SBU1 pin, SBU2 pin, TX+ pin, TX− pin, RX+ pin or RX− pin which are pins complying with the USB Type-C specification; wherein the second interface connection pin is different from the first interface connection pin.

11. The interface control circuit of claim 1, wherein before the first pull-down signal at the first interface connection pin is toggled to the first pull-up signal, a voltage at the second interface connection pin corresponds to a first level, and wherein after the first pull-down signal at the first interface connection pin is toggled to the first pull-up signal, when a first predetermined period has passed, the voltage at the second interface connection pin corresponds to a second level; and wherein before the first pull-up signal at the first interface connection pin is toggled to the first pull-down signal, the voltage at the second interface connection pin corresponds to a third level, and wherein after the first pull-up signal at the first interface connection pin is toggled to the first pull-down signal, when a second predetermined period has passed, the voltage at the second interface connection pin corresponds to a fourth level; and wherein before the first pull-down signal at the first interface connection pin is again toggled to the first pull-up signal, the voltage at the second interface connection pin corresponds to a fifth level; wherein the protection circuit is configured to operably determine whether the foreign object exists between the first interface connection pin and the second interface connection pin according to one of the following conditions:
    (1) a condition where the third level is greater than the second level;
    (2) a condition where the third level is greater than the fourth level;
    (3) a condition where the third level is greater than the fifth level;
    (4) a condition where a difference between the third level and the first level is greater than a threshold; or
    (5) a combination of two or more of the above conditions.

12. The interface control circuit of claim 9, wherein before the first pull-down signal at the first interface connection pin is toggled to the first pull-up signal, a voltage at the second interface connection pin corresponds to a first level, and wherein after the first pull-down signal at the first interface connection pin is toggled to the first pull-up signal, when a first predetermined period has passed, the voltage at the second interface connection pin corresponds to a second level; and wherein before the first pull-up signal at the first interface connection pin is toggled to the first pull-down signal, the voltage at the second interface connection pin corresponds to a third level, and wherein after the first pull-up signal at the first interface connection pin is toggled to the first pull-down signal, when a second predetermined period has passed, the voltage at the second interface connection pin corresponds to a fourth level; and wherein before the first pull-down signal at the first interface connection pin is again toggled to the first pull-up signal, the voltage at the second interface connection pin corresponds to a fifth level; wherein the protection circuit is configured to operably determine whether the foreign object exists between the first interface connection pin and the second interface connection pin according to one of the following conditions:
    (1) a condition where the third level is greater than the second level;
    (2) a condition where the third level is greater than the fourth level;
    (3) a condition where the third level is greater than the fifth level;
    (4) a condition where a difference between the third level and the first level is greater than a threshold; or
    (5) a combination of two or more of the above conditions.

13. The interface control circuit of claim 9, wherein before the first pull-down signal at the first interface connection pin is toggled to the first pull-up signal, a voltage at the second interface connection pin corresponds to a first level, and wherein before the first pull-up signal at the first interface connection pin is toggled to the first pull-down signal, the voltage at the second interface connection pin corresponds to a third level; wherein when a difference between the third level and the first level is greater than a threshold, the protection circuit determines the foreign object exists between the first interface connection pin and the second interface connection pin.

14. The interface control circuit of claim 1, wherein the foreign object is an electrolyte material, liquid or water.

15. The interface control circuit of claim 1, wherein the first interface connector circuit is a plug or a receptacle.

16. The interface control circuit of claim 1, wherein when it is determined that the foreign object indeed exists between the first interface connection pin and the second interface connection pin, the protection circuit performs one of the following operations:
    (1) the protection circuit controlling the first interface connection pin to be floating;
    (2) the protection circuit reducing an average current of the first pull-up signal;
    (3) the protection circuit outputting the first pull-down signal;
    (4) the protection circuit cutting off an external power path or an internal power path of the first interface connector circuit;
    (5) the protection circuit issuing an alarming signal; or
    (6) a combination of two or more of the above operations.

17. A control method for controlling an interface control circuit, wherein the interface control circuit complies with an interface specification, and wherein the interface control circuit includes an interface signal transceiver circuit coupled to a first interface connection pin and a second interface connection pin of a first interface connector circuit, the interface connector circuit being configured to operably transmit and/or receive an interface signal according to the interface specification; the control method comprising:
    under a first state, controlling the interface signal transceiver circuit to generate a first pull-up signal and a first pull-down signal which are toggled with each other at the first interface connection pin; and
    when the interface signal transceiver circuit operates under the first state, determining whether a foreign object exists between the first interface connection pin and the second interface connection pin according to a voltage change or a current change between a first time point and a second time point at the second interface connection pin;
    wherein the first time point and the second time point correspond respectively to a time point before and a time point after the first pull-up signal is toggle to the first pull-down signal or the first pull-down signal is toggled to the first pull-up signal; or the first time point and the second time point correspond respectively to two consecutive time points after the first pull-up signal is toggle to the first pull-down signal or the first pull-down signal is toggled to the first pull-up signal.

18. The control method of claim 17, wherein under the first state, the first interface connector circuit is not connected to any other interface connector circuit or a power supply connection pin of the first interface connector circuit has not yet been able to transmit power.

19. The control method of claim 17, wherein under the first state, the first pull-up signal and the first pull-down signal are periodically toggled with each other; wherein the control method further comprises:

periodically determining whether the foreign object exists between the first interface connection pin and the second interface connection pin according to the voltage change or the current change at the second interface connection pin.

20. The control method of claim 17, wherein under the first state, the second interface connection pin is floating or is coupled to a ground level via a second pull-down resistor.

21. The control method of claim 17, wherein under the first state, one of the first pull-up signal and the first pull-down signal corresponds to a floating state at the first interface connection pin.

22. The control method of claim 17, wherein the interface control circuit complies with a USB Type-C specification.

23. The control method of claim 22, wherein the first interface connection pin is a channel configuration pin of the USB Type-C specification, whereas, the second interface connection pin is one selected from a group consisting of VBUS pin, D+ pin, D− pin, SBU1 pin, SBU2 pin, TX+ pin, TX− pin, RX+ pin or RX− pin which are pins complying with the USB Type-C specification.

24. The control method of claim 23, wherein the first state corresponds to a connection-and-direction-detection state defined by the USB Type-C specification, wherein under the connection-and-direction-detection state and under a dual role port (DRP) mode, the interface signal transceiver circuit is configured to operably generate the first pull-up signal and the first pull-down signal which are toggled with each other at the channel configuration pin according to the USB Type-C specification, for detecting whether the first interface connector circuit is connected to another interface connector circuit and/or determine a power supply direction between the first interface connector circuit and another interface connector circuit.

25. The control method of claim 22, wherein the first interface connection pin is one selected from a group consisting of VBUS pin, D+ pin, D− pin, SBU1 pin, SBU2 pin, TX+ pin, TX− pin, RX+ pin or RX− pin which are pins complying with the USB Type-C specification, whereas, the second interface connection pin is one selected from a group consisting of VBUS pin, D+ pin, D− pin, SBU1 pin, SBU2 pin, TX+ pin, TX− pin, RX+ pin or RX− pin which are pins complying with the USB Type-C specification; wherein the second interface connection pin is different from the first interface connection pin.

26. The control method of claim 17, wherein before the first pull-down signal at the first interface connection pin is toggled to the first pull-up signal, a voltage at the second interface connection pin corresponds to a first level, and wherein after the first pull-down signal at the first interface connection pin is toggled to the first pull-up signal, when a first predetermined period has passed, the voltage at the second interface connection pin corresponds to a second level; and wherein before the first pull-up signal at the first interface connection pin is toggled to the first pull-down signal, the voltage at the second interface connection pin corresponds to a third level, and wherein after the first pull-up signal at the first interface connection pin is toggled to the first pull-down signal, when a second predetermined period has passed, the voltage at the second interface connection pin corresponds to a fourth level; and wherein before the first pull-down signal at the first interface connection pin is again toggled to the first pull-up signal, the voltage at the second interface connection pin corresponds to a fifth level; wherein the step of determining whether a foreign object exists includes one of the following:

(1) when the third level is greater than the second level, determining that the foreign object exists between the first interface connection pin and the second interface connection pin;

(2) when the third level is greater than the fourth level, determining that the foreign object exists between the first interface connection pin and the second interface connection pin;

(3) when the third level is greater than the fifth level, determining that the foreign object exists between the first interface connection pin and the second interface connection pin;

(4) when a difference between the third level and the first level is greater than a threshold, determining that the foreign object exists between the first interface connection pin and the second interface connection pin; or (5) two or more of the above in combination.

27. The control method of claim 24, wherein before the first pull-down signal at the first interface connection pin is toggled to the first pull-up signal, a voltage at the second interface connection pin corresponds to a first level, and wherein after the first pull-down signal at the first interface connection pin is toggled to the first pull-up signal, when a first predetermined period has passed, the voltage at the second interface connection pin corresponds to a second level, and wherein before the first pull-up signal at the first interface connection pin is toggled to the first pull-down signal, the voltage at the second interface connection pin corresponds to a third level, and wherein after the first pull-up signal at the first interface connection pin is toggled to the first pull-down signal, when a second predetermined period has passed, the voltage at the second interface connection pin corresponds to a fourth level, and wherein before the first pull-down signal at the first interface connection pin is again toggled to the first pull-up signal, the voltage at the second interface connection pin corresponds to a fifth level; wherein the step of determining whether a foreign object exists includes one of the following:

(1) when the third level is greater than the second level, determining that the foreign object exists between the first interface connection pin and the second interface connection pin;

(2) when the third level is greater than the fourth level, determining that the foreign object exists between the first interface connection pin and the second interface connection pin;

(3) when the third level is greater than the fifth level, determining that the foreign object exists between the first interface connection pin and the second interface connection pin;

(4) when a difference between the third level and the first level is greater than a threshold, determining that the foreign object exists between the first interface connection pin and the second interface connection pin; or (5) two or more of the above in combination.

28. The control method of claim 24, wherein before the first pull-down signal at the first interface connection pin is toggled to the first pull-up signal, a voltage at the second interface connection pin corresponds to a first level, and wherein before the first pull-up signal at the first interface connection pin is toggled to the first pull-down signal, the voltage at the second interface connection pin corresponds to a third level; wherein the step of determining whether a foreign object exists includes:

when a difference between the third level and the first level is greater than a threshold, determining that the foreign object exists between the first interface connection pin and the second interface connection pin.

29. The control method of claim 17, wherein when it is determined that the foreign object indeed exists between the first interface connection pin and the second interface connection pin, the control method further performs one of the following steps:
   (1) controlling the first interface connection pin to be floating;
   (2) reducing an average current of the first pull-up signal;
   (3) outputting the first pull-down signal;
   (4) cutting off an external power path or an internal power path of the first interface connector circuit;
   (5) issuing an alarming signal; or
   (6) a combination of two or more of the above steps.

* * * * *